(12) United States Patent
Chen et al.

(10) Patent No.: US 11,404,495 B2
(45) Date of Patent: Aug. 2, 2022

(54) OLED DISPLAY PANEL, FABRICATION METHOD THEREOF AND OLED DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Qicheng Chen, Beijing (CN); Ming Zhang, Beijing (CN); Jun Li, Beijing (CN); Tsungchieh Kuo, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 1038 days.

(21) Appl. No.: 16/073,873

(22) PCT Filed: Jan. 5, 2018

(86) PCT No.: PCT/CN2018/071496
§ 371 (c)(1),
(2) Date: Jul. 30, 2018

(87) PCT Pub. No.: WO2018/209979
PCT Pub. Date: Nov. 22, 2018

(65) Prior Publication Data
US 2021/0210559 A1    Jul. 8, 2021

(30) Foreign Application Priority Data
May 17, 2017  (CN) .......................... 201710347522.2

(51) Int. Cl.
*H01L 27/32* (2006.01)
*H01L 51/52* (2006.01)
*H01L 51/56* (2006.01)

(52) U.S. Cl.
CPC ........ *H01L 27/323* (2013.01); *H01L 51/5253* (2013.01); *H01L 51/56* (2013.01); *H01L 2227/323* (2013.01)

(58) Field of Classification Search
CPC ... H01L 27/323; H01L 51/5253; H01L 51/56; H01L 2227/323; H01L 21/5338; G06F 2203/04102
(Continued)

(56) References Cited

U.S. PATENT DOCUMENTS

2012/0075218 A1  3/2012  Lin et al.
2014/0218328 A1  8/2014  Haapakoski et al.
(Continued)

FOREIGN PATENT DOCUMENTS

CN    103984442 A    8/2014
CN    104793804 A    7/2015
(Continued)

OTHER PUBLICATIONS

First Office Action for Chinese Patent Application No. 201710347522.2 dated Jun. 29, 2018.
(Continued)

*Primary Examiner* — Thinh T Nguyen
(74) *Attorney, Agent, or Firm* — Calfee, Halter & Griswold LLP

(57) ABSTRACT

The embodiments of the present disclosure provide an OLED display panel, a fabrication method thereof and an OLED display device, which improve optical, mechanical, and electrical characteristics of the OLED display panel. The OLED display panel includes an OLED light-emitting layer
(Continued)

and touch electrodes. The touch electrode includes a first touch electrode layer and a second touch electrode layer, and the OLED light-emitting layer is disposed between the first touch electrode layer and the second touch electrode layer.

11 Claims, 3 Drawing Sheets

(58) Field of Classification Search
USPC .......................................... 257/40; 438/82, 99
See application file for complete search history.

(56) References Cited

U.S. PATENT DOCUMENTS

| | | | |
|---|---|---|---|
| 2017/0108979 | A1 | 4/2017 | Lu et al. |
| 2018/0108710 | A1* | 4/2018 | Lin et al. ................ H01L 27/32 |
| 2018/0158875 | A1 | 6/2018 | Dong et al. |
| 2018/0348926 | A1* | 12/2018 | Su ......................... H01L 27/323 |

FOREIGN PATENT DOCUMENTS

| | | | |
|---|---|---|---|
| CN | 104795425 | A | 7/2015 |
| CN | 106227379 | A | 12/2016 |
| CN | 107170780 | A | 9/2017 |

OTHER PUBLICATIONS

Search Report and Written Opinion for International Application No. PCT/CN2018/071496 dated Mar. 30, 2018.

\* cited by examiner

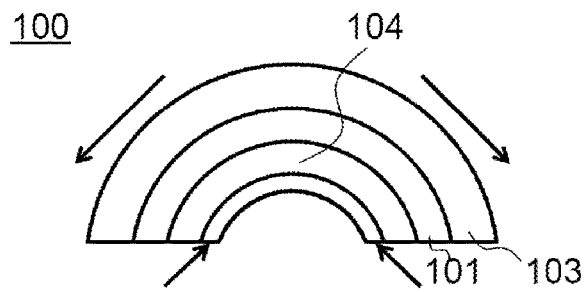
Fig. 4
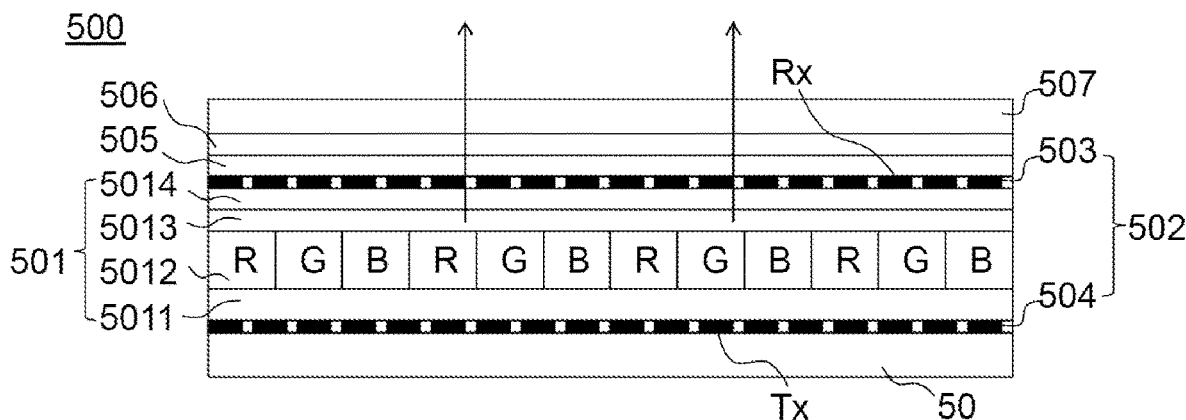
Fig. 5
600
forming an OLED light-emitting layer and touch electrodes; the touch electrodes includes a first touch electrode layer and a second touch electrode layer, and the OLED light-emitting layer is disposed between the first touch electrode layer and the second touch electrode layer — S1
Fig. 6

OLED DISPLAY PANEL, FABRICATION METHOD THEREOF AND OLED DISPLAY DEVICE

RELATED APPLICATIONS

The present application is the U.S. national phase entry of the international application PCT/CN2018/071496, with an international filing date of Jan. 5, 2018, which claims the benefit of Chinese Patent Application No. 201710347522.2, filed on May 17, 2017, the entire disclosures of which are incorporated herein by reference.

TECHNICAL FIELD

The present disclosure relates to the field of display technology, in particular to an OLED display panel, a fabrication method of the OLED display panel, and an OLED display device.

BACKGROUND

The OLED (organic light-emitting diode) display is becoming a mainstream technology in the display field due to its characteristics of flexibility, lightness and thinness. Markets such as the smartphone and the wearable device are in urgent need of expansion in the field of flexible touch product. In the existing flexible OLED touch technology, a film is generally attached to an encapsulation layer for OLED, a touch sensor is formed on the film, and then a polarizer and a cover glass are attached. The structure of the touch sensor equipped with the OLED is generally externally mounted, that is, the touch sensor is formed on a substrate of PET (polyethylene terephthalate) or COP (cyclo-olefin polymer), and the substrate is then attached to the OLED.

SUMMARY

Embodiments of the present disclosure provide an OLED display panel, a fabrication method of the OLED display panel, and an OLED display device, which improve optical, mechanical, and electrical characteristics of the OLED display panel.

According to an aspect of the present disclosure, an embodiment of the present disclosure provides an OLED display panel. The OLED display panel includes an OLED light-emitting layer and touch electrodes. The touch electrodes include a first touch electrode layer and a second touch electrode layer, and the OLED light-emitting layer is disposed between the first touch electrode layer and the second touch electrode layer.

In certain exemplary embodiments, the OLED display panel is a flexible OLED display panel.

In certain exemplary embodiments, the OLED light-emitting layer includes a first surface and a second surface, the first touch electrode layer is disposed directly on the first surface, and the second touch electrode layer is disposed directly on the second surface.

In certain exemplary embodiments, the OLED light-emitting layer includes a substrate, a light-emitting material layer and an encapsulation layer which are sequentially stacked.

In certain exemplary embodiments, the encapsulation layer is a thin film encapsulation layer.

In certain exemplary embodiments, the OLED light-emitting layer includes a light-emitting side and a non-light-emitting side, the first touch electrode layer is disposed on the light-emitting side, and the second touch electrode layer is disposed on the non-light-emitting side; the first touch electrode layer includes touch sensing electrodes, and the second touch electrode layer includes touch driving electrodes.

According to another aspect of the present disclosure, an embodiment of the present disclosure further provides a fabrication method of the OLED display panel as described in any of the above embodiments. The method includes: forming an OLED light-emitting layer and touch electrodes; the touch electrodes includes a first touch electrode layer and a second touch electrode layer, and the OLED light-emitting layer is disposed between the first touch electrode layer and the second touch electrode layer.

In certain exemplary embodiments, the step of forming an OLED light-emitting layer and touch electrodes includes: forming the first touch electrode layer; forming the OLED light-emitting layer on a surface of the first touch electrode layer; and forming the second touch electrode layer on a surface of light-emitting layer facing away from the first touch electrode layer.

In certain exemplary embodiments, the step of forming an OLED light-emitting layer and touch electrodes includes: forming the OLED light-emitting layer; forming the first touch electrode layer on a first surface of the OLED light-emitting layer; and forming the second touch electrode layer on a second surface of the OLED light-emitting layer.

According to yet another aspect of the present disclosure, an embodiment of the present disclosure further provides an OLED display device. The OLED display device includes the OLED display panel as described in any one of the above embodiments.

BRIEF DESCRIPTION OF THE DRAWINGS

FIG. 4 is a schematic diagram showing a bent state of a flexible OLED display panel provided by an embodiment of the present disclosure;

FIG. 5 is a structural schematic diagram of an OLED display panel according to another embodiment of the present disclosure;

FIG. 6 is a flow chart of a fabrication method of an OLED display panel according to an embodiment of the present disclosure;

DETAILED DESCRIPTION OF THE DISCLOSURE

Figure 1:
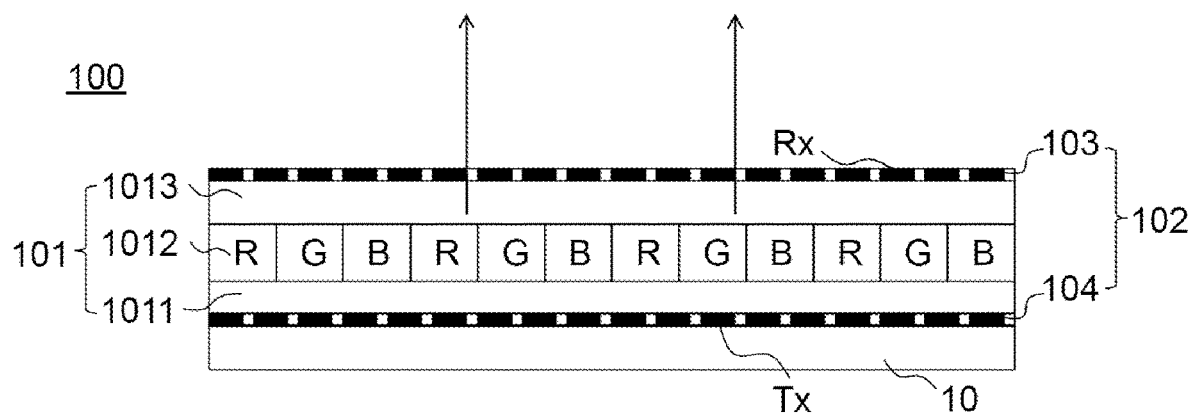
FIG. 1 is a structural schematic diagram of an OLED display panel according to an embodiment of the present disclosure.

In the following, the technical solutions in the embodiments of the disclosure will be described clearly and completely in connection with the drawings in the embodiments of the disclosure. Obviously, the described embodiments are only part of the embodiments of the disclosure, and not all of the embodiments. Based on the embodiments in the disclosure, all other embodiments obtained by those of ordinary skills in the art under the premise of not paying out creative work pertain to the protection scope of the disclosure.

The shapes and thickness of the film layer in the drawings do not reflect the real scale of the film layers, but to schematically illustrate the content of the disclosure.

For an OLED display panel of a GFF structure, in a bent state, stresses on two conductive layers of a touch sensor are in different directions, which will cause separation or breakage of these two conductive layers, affecting the electrical performance of the product. In addition, if these two conductive layers of the touch sensor are formed on the same side of the OLED display panel, the difference in reflectance between the two conductive layers may cause problems such as shadow elimination or moire fringe, which may affect the display effect.

According to an aspect of the present disclosure, an embodiment of the present disclosure provides an OLED display panel. FIG. 1 is a structural schematic diagram of an OLED display panel according to the embodiment of the present disclosure. As shown in FIG. 1, the OLED display panel 100 includes stacked OLED light-emitting layer 101 and touch electrodes 102. The touch electrodes 102 include a first touch electrode layer 103 and a second touch electrode layer 104. The OLED light-emitting layer 101 is disposed between the first touch electrode layer 103 and the second touch electrode layer 104.

The OLED light-emitting layer 101 may include a light-emitting layer substrate 1011, a light-emitting material layer 1012 and an encapsulation layer 1013. The OLED display panel 100 can further include a substrate 10, and the substrate 10 can be made of a plastic material or a glass material.

Figure 2:
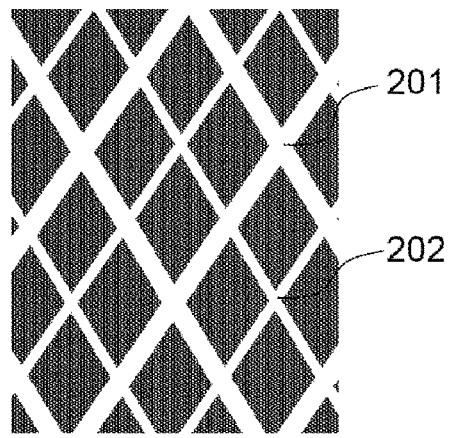
FIG. 2 shows reflection fringes observed when a first touch electrode layer and a second touch electrode layer are disposed on the same side of an OLED light-emitting layer.

In the embodiment of the present disclosure, the OLED light-emitting layer is disposed between the first touch electrode layer and the second touch electrode layer. That is, as shown in FIG. 1, the first touch electrode layer 103 and the second touch electrode layer 104 are respectively disposed on the top side and bottom side of the OLED light-emitting layer 101. FIG. 2 shows reflection fringes observed when a first touch electrode layer and a second touch electrode layer are disposed on the same side of the OLED light-emitting layer, and the reflection fringe 201 and 202 are respectively caused by electrodes in these two touch electrode layers. Compared with the arrangement in which the first touch electrode layer and the second touch electrode layer are located on the same side of the OLED light-emitting layer, the light beam reflected by the first touch electrode layer and the second touch electrode layer in the embodiment of the present disclosure will be less visible (i.e., the difference in reflectance between the touch electrodes and other layers is reduced), improving the shadow elimination effect. Moreover, since the first touch electrode layer and the second touch electrode layer are respectively disposed on the top side and bottom side of the OLED light-emitting layer, the mesh density of the touch electrodes visible to the viewer is reduced accordingly, and the problem of moire fringe is further eliminated. In addition, such a structure can directly use the OLED layer as the substrate of the touch electrodes, thereby saving the substrate material (PET or COP) of the touch electrodes, reducing the thickness of the product and the production cost.

Optionally, the OLED display panel is a flexible OLED display panel.

Figure 3:
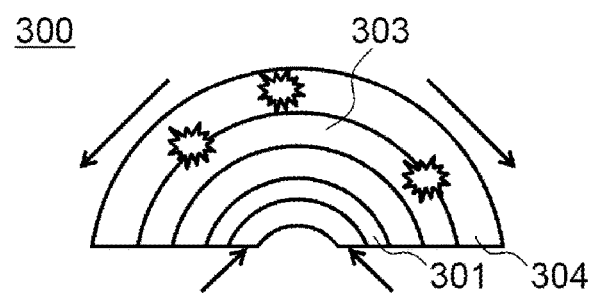
FIG. 3 is a schematic diagram showing a bent state of a flexible OLED display panel provided by the related art.

In some embodiments, as shown in FIG. 1, the OLED display panel 100 is a flexible OLED display panel. It is found that, as shown in FIG. 3, in a flexible OLED display panel 300 of the related art, touch electrode layers 303, 304 of the touch electrodes are both disposed on the same side of the OLED light-emitting layer 301. When the flexible OLED display panel 300 is bent, stresses on the touch electrode layers 303, 304 are in different directions (as indicated by arrows in FIG. 3), thus the touch electrode layers are separated or the outermost touch electrode layer is broken, which affects the electrical performance of the product. As shown in FIG. 4, with the arrangement of the embodiment of the present disclosure, when the flexible OLED display panel 100 is bent, the OLED light-emitting layer 101 is at a center position, and the stress on the light-emitting layer 101 is minimal. Moreover, since the first touch electrode layer 103 and the second touch electrode layer 104 are respectively disposed on the top side and bottom side of the OLED light-emitting layer 101, stresses on the first touch electrode layer 103 and the second touch electrode layer 104 are also relatively small, the separation between the two touch electrode layers or the break of the outermost touch electrode layer is effectively avoided, and good electrical performance of the product are maintained.

Optionally, the OLED light-emitting layer includes a first surface and a second surface, the first touch electrode layer is disposed directly on the first surface, and the second touch electrode layer is disposed directly on the second surface.

In some embodiments, as shown in FIG. 1, the first touch electrode layer 103 is disposed directly on the first surface of the OLED light-emitting layer 101, and the second touch electrode layer 104 is disposed directly on the second surface of the OLED light-emitting layer 101. For example, the OLED light-emitting layer 101 can include a substrate 1011, a light-emitting material layer 1012 and an encapsulation layer 1013 which are sequentially stacked. The first touch electrode layer 103 is disposed directly on a surface of the encapsulation layer 103 facing away from the substrate 1011, the second touch electrode layer 104 is disposed directly on a surface of the substrate 1011 facing away from the encapsulation layer 1013. In the context of the present disclosure, "disposed directly on a surface" means being disposed on and in contact with the surface. It can be understood by those skilled in the art that the OLED light-emitting layer can further include other functional layers, and the first touch electrode layer and the second touch electrode layer are disposed directly on the top side and bottom side of the OLED light-emitting layer respectively. Therefore, the OLED layer can be directly used as the substrate of the touch electrodes, thereby saving the substrate material (PET or COP) of the touch electrodes, reducing the thickness of the product, and reducing the production cost.

As shown in FIG. 5, in some embodiments, the OLED display panel 500 can include an OLED light-emitting layer 501 and touch electrodes 502. The touch electrodes 502 include a first touch electrode layer 503 and a second touch electrode layer 504. The OLED light-emitting layer 501 is disposed between the first touch electrode layer 503 and the second touch electrode layer 504. The OLED light-emitting layer 501 can include a light-emitting layer substrate 5011, a light-emitting material layer 5012 and an encapsulation layer 5013. The OLED display panel 500 can further include a substrate 50, and the substrate 50 can be made of a plastic material or a glass material. The light-emitting layer substrate 5011 can include a circuit for driving each of the light-emitting pixels R, G, or B, such as a low temperature polysilicon (LTPS)circuit. The OLED light-emitting layer 501 can further include a barrier layer 5014 disposed on a surface of the encapsulation layer 5013 facing away from the light-emitting layer substrate 5011. The barrier layer 5014 can be made of an organic material. In addition, a polarizer 505, an optical adhesive (OCA) 506, and a cover glass 507 can be further disposed on the upper surface of the first touch electrode layer 503.

Optionally, the OLED light-emitting layer includes a substrate, a light-emitting material layer and an encapsulation layer which are sequentially stacked.

In some embodiments, as shown in FIG. 1 and FIG. 5, the encapsulation layers 1013, 5013 cover the surfaces of light-emitting material layers 1012, 5012 to avoid infiltration of oxygen and moisture into the light-emitting material layer.

Optionally, the encapsulation layer is a thin film encapsulation layer.

In some embodiments, encapsulating the OLED device with a thin film encapsulation layer reduces the thickness of the product and facilitates flexible display.

Optionally, the OLED light-emitting layer includes a light-emitting side and a non-light-emitting side, the first touch electrode layer is disposed on the light-emitting side, and the second touch electrode layer is disposed on the non-light-emitting side; the first touch electrode layer includes touch sensing electrodes (Rx), and the second touch electrode layer includes touch driving electrodes (Tx).

In some embodiments, as shown in FIG. 1 and FIG. 5, the OLED light-emitting layer emits light (indicated by the arrows in FIG. 1 and FIG. 5) toward one side of the OLED display panel. The touch driving electrodes Tx are disposed on the non-light-emitting side of the OLED light-emitting layer, and the touch sensing electrodes Rx are disposed on the light-emitting side of the OLED light-emitting layer. That is, the touch sensing electrodes Rx are disposed on a side of the OLED display panel facing the viewer. Such an arrangement is advantageous for sensing and collecting touch information, thereby improving the accuracy of touch positioning. It can be understood by those skilled in the art that the OLED light-emitting layer can also emit light on both sides simultaneously. In this case, the positions of the touch sensing electrodes and the touch driving electrodes are interchangeable.

According to another aspect of the present disclosure, an embodiment of the present disclosure further provides a fabrication method of the OLED display panel as described in any of the above embodiments. As shown in FIG. 6, the method 600 includes: step S1, forming an OLED light-emitting layer and touch electrodes; the touch electrodes includes a first touch electrode layer and a second touch electrode layer, and the OLED light-emitting layer is disposed between the first touch electrode layer and the second touch electrode layer.

Compared with the arrangement in which the first touch electrode layer and the second touch electrode layer are located on the same side of the OLED light-emitting layer, the light beam reflected by the first touch electrode layer and the second touch electrode layer in the embodiment of the present disclosure will be less visible (i.e., the difference in reflectance between the touch electrodes and other layers is reduced), improving the shadow elimination effect. Moreover, since the first touch electrode layer and the second touch electrode layer are respectively disposed on the top side and bottom side of the OLED light-emitting layer, the mesh density of the touch electrodes visible to the viewer is reduced accordingly, and the problem of moire fringe is further eliminated. In addition, such a structure can directly use the OLED layer as the substrate of the touch electrodes, thereby saving the substrate material (PET or COP) of the touch electrodes, reducing the thickness of the product and the production cost.

Figure 7:
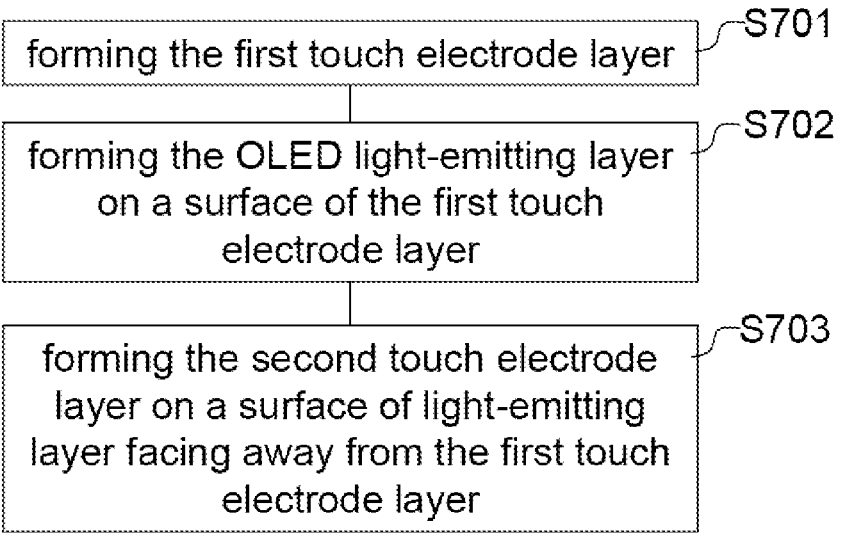
FIG. 7 is a flow chart of a fabrication method of an OLED display panel according to another embodiment of the present disclosure.

In certain exemplary embodiments, as shown in FIG. 7, the step S1 of forming an OLED light-emitting layer and touch electrodes includes: S701 forming the first touch electrode layer; S702 forming the OLED light-emitting layer on a surface of the first touch electrode layer; and S703 forming the second touch electrode layer on a surface of light-emitting layer facing away from the first touch electrode layer.

Figure 8:
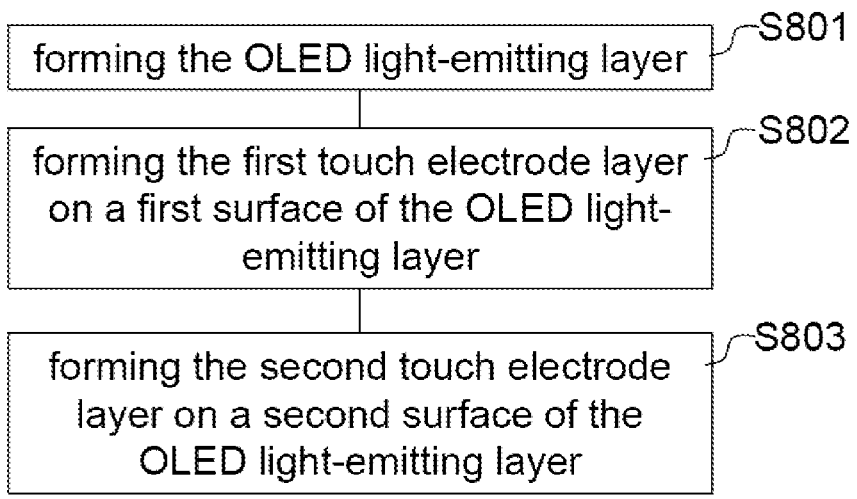
FIG. 8 is a flow chart of a fabrication method of an OLED display panel according to yet another embodiment of the present disclosure.

In certain exemplary embodiments, as shown in FIG. 8, the step S1 of forming an OLED light-emitting layer and touch electrodes includes: S801 forming the OLED light-emitting layer; S802 forming the first touch electrode layer on a first surface of the OLED light-emitting layer; and S803 forming the second touch electrode layer on a second surface of the OLED light-emitting layer.

In some embodiments, the OLED display panel can be fabricated in the order of the first touch electrode layer, the OLED light-emitting layer, the second touch electrode layer. Alternatively, the OLED display panel can also be fabricated in the order of the OLED light-emitting layer, the first touch electrode layer, the second touch electrode layer. Therefore, the OLED display panel of the embodiments of the present disclosure can be fabricated in flexible orders.

The fabrication method of the OLED display panel provided by the embodiments of the present disclosure is exemplarily described below with reference to the embodiment shown in FIG. 5.

First, a conductive layer is disposed on the substrate 50 by a process such as sputtering, and the conductive layer is processed by a photolithography process (e.g., a yellow light process) to form a conductive mesh of the second touch electrode layer (e.g., Tx) 504. An OC photoresist layer (not shown in FIG. 5) is applied on the conductive mesh of the second touch electrode layer (Tx) 504. The OC photoresist layer can serve as an insulating layer between the OLED light-emitting layer 501 and the second touch electrode layer (Tx) 504. The OC photoresist layer can also be used as a planarization layer under the OLED light-emitting layer 501 to further improve the performance of the OLED light-emitting layer 501.

Then, a light-emitting layer substrate 5011 is disposed on the OC photoresist layer, and an OLED light-emitting material layer 5012 and OLED electrodes are formed on the light-emitting layer substrate 5011. Next, an encapsulation layer 5013 is formed using TFE encapsulating technology to avoid infiltration of oxygen and moisture into the light-emitting material layer. A barrier layer 5014 of an organic material is formed on the surface of the encapsulation layer 5013. Alternatively, an OC photoresist layer can also be formed on the surface of the encapsulation layer 5013 to serve as an insulating layer and a planarization layer.

A conductive layer is disposed on the barrier layer 5014 by a process such as sputtering, and the conductive layer is processed by a photolithography process (e.g., a yellow light process) to form a conductive mesh of the first touch electrode layer (e.g., Rx) 503. A polarizer 505, an optical adhesive 506, and a cover glass 507 can be further disposed on the upper surface of the first touch electrode layer 503, thereby obtaining the OLED display panel 500 as shown in FIG. 5.

Based on the same concept, an embodiment of the present disclosure further provides an OLED display device, which includes the above OLED display panel provided by the embodiment of the present disclosure. The OLED display device can be any product or component with display function such as a mobile phone, a tablet computer, a television, a display, a notebook computer, a digital photo frame and a navigator. For the implementation of the OLED display device, reference can be made to the embodiment of the above OLED display panel, which will not be described in details herein.

According to the OLED display panel, the fabrication method of the OLED display panel and the OLED display device provided by embodiments of the present disclosure, the first touch electrode layer and the second touch electrode layer are respectively disposed on the top side and bottom side of the OLED light-emitting layer. Compared with the arrangement in which the first touch electrode layer and the second touch electrode layer are located on the same side of the OLED light-emitting layer, the light beam reflected by the first touch electrode layer and the second touch electrode layer in the embodiment of the present disclosure will be less visible (i.e., the difference in reflectance between the touch electrodes and other layers is reduced), improving the shadow elimination effect. Moreover, since the first touch electrode layer and the second touch electrode layer are respectively disposed on the top side and bottom side of the OLED light-emitting layer, the mesh density of the touch electrodes visible to the viewer is reduced accordingly, and the problem of moire fringe is further eliminated. In addition, such a structure can directly use the OLED layer as the substrate of the touch electrodes, thereby saving the substrate material (PET or COP) of the touch electrodes, reducing the thickness of the product and the production cost. When the OLED display panel is bent, stresses on the first touch electrode layer and the second touch electrode layer are relatively small, the separation between the two touch electrode layers or the break of the outermost touch electrode layer is effectively avoided, and good electrical performance of the product are maintained.

A person skilled in the art may make various alterations and variations to the invention without departing the spirit and scope of the invention. As such, provided that these modifications and variations of the invention pertain to the scope of the claims of the invention and their equivalents, the invention is intended to embrace these alterations and variations.

What is claimed is:

1. An OLED display panel, comprising:
   an OLED light-emitting layer and touch electrodes;
   wherein the touch electrodes comprise a first touch electrode layer and a second touch electrode layer, and the OLED light-emitting layer is disposed between the first touch electrode layer and the second touch electrode layer;
   wherein the OLED display panel is a flexible OLED display panel; the OLED light-emitting layer comprises a light-emitting side and a non-light-emitting side, the first touch electrode layer is disposed on the light-emitting side, and the second touch electrode layer is disposed on the non-light-emitting side; the first touch electrode layer comprises touch sensing electrodes, and the second touch electrode layer comprises touch driving electrodes.

2. The OLED display panel according to claim 1, wherein the OLED light-emitting layer comprises a first surface and a second surface, the first touch electrode layer is disposed directly on the first surface, and the second touch electrode layer is disposed directly on the second surface.

3. The OLED display panel according to claim 1, wherein the OLED light-emitting layer comprises a substrate, a light-emitting material layer and an encapsulation layer which are sequentially stacked.

4. The OLED display panel according to claim 3, wherein the encapsulation layer is a thin film encapsulation layer.

5. A fabrication method of an OLED display panel, comprising:
   forming an OLED light-emitting layer and touch electrodes;
   wherein the touch electrodes comprise a first touch electrode layer and a second touch electrode layer, and the OLED light-emitting layer is disposed between the first touch electrode layer and the second touch electrode layer,
   wherein the OLED display panel is a flexible OLED display panel; the OLED light-emitting layer comprises a light-emitting side and a non-light-emitting side, the first touch electrode layer is disposed on the light-emitting side, and the second touch electrode layer is disposed on the non-light-emitting side; the first touch electrode layer comprises touch sensing electrodes, and the second touch electrode layer comprises touch driving electrodes.

6. The method according to claim 5, wherein forming an OLED light-emitting layer and touch electrodes comprises:
   forming the first touch electrode layer;
   forming the OLED light-emitting layer on a surface of the first touch electrode layer; and
   forming the second touch electrode layer on a surface of light-emitting layer facing away from the first touch electrode layer.

7. The method according to claim 5, wherein forming an OLED light-emitting layer and touch electrodes comprises:
   forming the OLED light-emitting layer;
   forming the first touch electrode layer on a first surface of the OLED light-emitting layer; and
   forming the second touch electrode layer on a second surface of the OLED light-emitting layer.

8. An OLED display device comprising the display panel according to claim 1.

9. The OLED display device according to claim 8, wherein the OLED light-emitting layer comprises a first surface and a second surface, the first touch electrode layer is disposed directly on the first surface, and the second touch electrode layer is disposed directly on the second surface.

10. The OLED display device according to claim 8, wherein the OLED light-emitting layer comprises a substrate, a light-emitting material layer and an encapsulation layer which are sequentially stacked.

11. The OLED display device according to claim 10, wherein the encapsulation layer is a thin film encapsulation layer.

* * * * *